United States Patent [19]
Fillion et al.

[11] Patent Number: 5,532,512
[45] Date of Patent: Jul. 2, 1996

[54] DIRECT STACKED AND FLIP CHIP POWER SEMICONDUCTOR DEVICE STRUCTURES

[75] Inventors: Raymond A. Fillion; Eric J. Wildi, both of Niskayuna; Charles S. Korman; Sayed-Amr El-Hamamsy, both of Schenectady; Steven M. Gasworth, Glenville; Michael W. DeVre, Scotia; James F. Burgess, Schenectady, all of N.Y.

[73] Assignee: General Electric Company, Schenectady, N.Y.

[21] Appl. No.: 316,996

[22] Filed: Oct. 3, 1994

[51] Int. Cl.$^6$ .......................... H01L 23/02; H01L 23/48; H05K 7/20
[52] U.S. Cl. .......................... 257/686; 257/723; 257/712; 257/778; 361/601; 361/705; 361/713; 361/735
[58] Field of Search ....................... 257/686, 685, 257/691, 678, 728, 734, 777, 778, 780, 737, 738; 361/600, 601, 614, 679, 688, 705, 713, 717, 735, 729; 257/723, 724, 725, 712, 713; 333/246, 247

[56] References Cited

U.S. PATENT DOCUMENTS

| | | | |
|---|---|---|---|
| 5,019,946 | 5/1991 | Eichelberger et al. | 361/414 |
| 5,200,810 | 4/1993 | Wojnarowski et al. | 361/398 |

OTHER PUBLICATIONS

Natarajan et al., "Diamondlike carbon films: Optical absorption, dielectric properties, and hardness dependence on deposition parameters", J. Vac. Sci. Technol. A3(3), May/Jun. 1985, pp. 681–685.

Davidson et al., "Multilevel DLC (Diamondlike Carbon) capacitor structure", SPIE, vol. 871, Space Structures, Power, and Power Conditioning (1988), pp. 308–312.

Primary Examiner—Sara W. Crane
Assistant Examiner—Carl Whitehead, Jr.
Attorney, Agent, or Firm—Marvin Snyder

[57] ABSTRACT

Power semiconductor device structures and assemblies with improved heat dissipation characteristics and low impedance interconnections include a thermally-conductive dielectric layer, such as diamondlike carbon (DLC) overlying at least portions of the active major surface of a semiconductor chip, with vias formed in the dielectric layer in alignment with contact pads on the active major surface. A patterned metallization layer is formed over the thermally-conductive dielectric layer, with portions of the metallization layer extending through the vias into electrical contact with the chip contact pads. A metal structure is electrically and thermally coupled to selected areas of the patterned metallization, such as by solder bonding or by a eutectic bonding process. In different embodiments, the metal structure may comprise a metal conductor bonded to the opposite major surface of another power semiconductor device structure, a heat-dissipating device-mounting structure, or simply a low-impedance lead.

22 Claims, 5 Drawing Sheets

DIRECT STACKED AND FLIP CHIP POWER SEMICONDUCTOR DEVICE STRUCTURES

BACKGROUND OF THE INVENTION

The present invention relates generally to the packaging and interconnection of power semiconductor devices and, more particularly, to device structures and assemblies with improved heat dissipation characteristics and low impedance interconnections.

Power semiconductor devices of various types are well known, such as power MOSFETs (metal oxide field effect transistors), and IGBTs (insulated gate bipolar transistors) which are employed in power switching applications. Prior to any packaging or interconnection, these devices generally are in the form of a semiconductor chip having an active major surface, or top side, and an opposite major surface, or bottom side. The active major surface is patterned and has metallized I/O (input/output) pads including, in the case of a power semiconductor device, at least two terminals, i.e., a device main terminal, such as the source, and a control terminal, such as a gate. In typical devices, in order to provide low impedance connections, there are multiple main terminals on the active surface, all to be connected in parallel, and one or more control terminals, likewise to be connected in parallel. The uniform opposite major surface or bottom side of the chip comprises another main terminal, such as the drain. Fabrication steps for fabricating the chip generally are performed on the active major surface, and the various semiconductor junctions internal to the chip are relatively nearer the active major surface than the opposite major surface.

Standard approaches to packaging result in the power semiconductor devices being mounted on a metal pad which is located on an insulating substrate such as $Al_2O_3$. Such substrate provides the required electrical insulation, and additionally a good coefficient of thermal expansion match to silicon devices. The $Al_2O_3$ insulating substrate must be as thin as possible because it is in the thermal path through which device heat is dissipated, and $Al_2O_3$ is a relatively poor thermal conductor.

For connections to the source and gate terminals located on the active major surface or top of the chip, wire bonds are conventionally employed. Wire bond connections however have the disadvantage of resulting in relatively high source and gate inductance and resistance. In addition, in circuit topologies where multiple power semiconductor devices are connected in parallel, wire bond connections result in varying conductor lengths to the gate pads on the various devices. Such conductor length variations can cause some devices to receive gating signals before others. Because the devices thus do not all turn on or off in unison, performance degradation results.

In one typical configuration, a printed circuit board mounted above the power devices includes various control and passive elements, and leads or wires are soldered between the power devices and the printed circuit board. In another configuration, the power devices and controls are mounted on a common substrate. This configuration, however, potentially increases complexity, and pushes thermal limits.

In the context of one of the embodiments of the invention, most of the device heat is generated near the active major surface or top of the chip where the semiconductor junctions are located, rather than near the opposite major surface or bottom of the chip. Nevertheless, power semiconductor devices are typically mounted to a heat sink via the bottom of the chip, which is uniform and facilitates mounting as a practical matter. During device operation, junction temperature is the predominant limiter of device power dissipation and reliability. Power semiconductor devices are typically derated in their operating limits, that is, voltage, current, power and/or frequency are derated, based on the operating junction temperature. The higher the junction temperature, the more the operating parameters are derated and the lower the device performance.

Disclosed in commonly-assigned Fillion et al application Ser. No. 08/192,533, filed Feb. 7, 1994, entitled "Wireless Radio Frequency Power Semiconductor Devices Using High Density Interconnect", is a component package which, rather than the conventional $Al_2O_3$ ceramic insulator below the chip, employs a direct bond copper BeO substrate which offers significantly better thermal performance. In the package described in application Ser. No. 08/192,533, a polyimide film in the range of from one to four mils in thickness is bonded over the active major surface of the power device or devices, so as to bridge to the direct bond copper surface. Vias are formed in the polyimide film over the source and gate pads, for example, employing laser ablation, plasma etch or wet chemistry. The entire polyimide film surface is metallized and patterned, connecting the source and gate pads to the direct bond copper metal, and/or to the source and gate terminals of other chips. The structure described in application Ser. No. 08/192,533 has improved thermal, mechanical and electrical performance compared to prior art configurations. Nevertheless, further improvements can be made, particularly in the context of heat dissipation. Additionally, the structure described in application Ser. No. 08/192,533 is not suitable for the stacked device configuration disclosed herein for half bridge circuit topologies.

Thus, a common circuit topology, particularly relevant in the context of the present invention, is the half bridge in which two semiconductor power switching devices, such as power transistors, are connected in series. Employing MOSFET terminology for example, the source terminal of one device is connected to the drain terminal of another device, and the two devices have respective, independently connected, gate control terminals. Employing bipolar terminology as another example, the emitter terminal of one device is connected to the collector terminal of another device, and the two devices have respective, independently connected, base or gate control terminals. Other conventional circuit elements include series gate resistors, bidirectional Zener diodes for gate protection, and output protection networks comprising capacitors and diodes. Other circuit topologies relevant in the context of the invention include multiple half bridge circuit topologies wherein several half bridge integrated circuit chip sets are connected in parallel for increased power-handling capability.

While implementation of the aforementioned half bridge circuits may seem straightforward, there are practice difficulties in realizing these circuits with actual devices. Typical assembly methods implementing the aforementioned half bridge circuit topologies place the semiconductor devices in a common plane, with wire bonds to the source and gate leads as described hereinabove. Series resistance losses and gate parasitics can result, particularly at higher switching speeds. With multiple half bridge integrated circuit chip sets, gate parasitics and series losses are even more severe.

In order for the individual devices to turn on and off at the same time, it is desirable for the conductor lengths to the various devices, most particularly the gate conductors, to all be of the same length. In addition, low-impedance connections are highly desirable.

SUMMARY OF THE INVENTION

Accordingly, it is an object of the invention to provide power semiconductor device packaging structures with low impedance current carrying paths and low gate parasitics.

It is another object of the invention to provide a power semiconductor device configuration particularly suitable for half bridge circuit topologies.

It is yet another object of the invention to provide power semiconductor packaging configurations with improved thermal performance so as to achieve higher rated operating values, higher reliability and longer operating life.

Briefly, in accordance with the invention a power semiconductor device structure comprising a semiconductor chip includes a thermally-conductive dielectric layer overlying at least portions of the active major surface of the chip, and vias are formed in the dielectric layer in alignment with the contact pads. A patterned metallization layer is formed over the thermally-conductive dielectric layer, and portions of the patterned metallization layer extend through the vias into electrical contact with the chip contact pads. A metal structure is electrically and thermally bonded to selected areas of the patterned metallization, such as by soldering or by a eutectic bonding process. In various embodiments, the metal structure may comprise a metal conductor bonded to the opposite major surface of another power semiconductor device structure, the metal structure may comprise a heat-dissipating device-mounting structure, or the metal structure may comprise simply a low-impedance lead.

The thermally-conductive dielectric layer may comprise diamondlike carbon (DLC) which can be vacuum deposited at or near room temperature in the form of pin-hole free films as thin as tens of angstroms. The thickness of the diamondlike carbon is, for example, within the approximate range of ten to fifty angstroms. At such small thicknesses, the DLC film has insignificant thermal resistance and does not impede heat transfer. The high resistivity and high breakdown strength of DLC also contribute to its suitability for this application.

In contrast, a polyimide or other plastic dielectric, such as is disclosed in application Ser. No. 08/192,533, would be unacceptable in the configurations disclosed herein because such dielectric materials are good thermal insulators.

In one more embodiment of the invention, particularly applicable to a half bridge circuit configuration, first and second power semiconductor device structures are provided, each as summarized hereinabove. The metal structure electrically and thermally bonded to respective selected areas of each patterned metallization as summarized above comprises, in this embodiment, a metal electrode structure. The two metal electrode structures are stacked, with the opposite or bottom major surface of a first semiconductor chip electrically and thermally bonded to the metal electrode structure of the second or lower power semiconductor device structure through solder or a eutectic bonding technique.

In still another embodiment, a "flip chip" mounting is provided wherein a heat-dissipating device-mounting structure, including metal pads for electrical connection to the contact pads on the upper major surface of the chip, is employed, such as a hybrid substrate or a package cavity. The power semiconductor device structure, as summarized hereinabove, is mounted by bonding selected areas of the patterned metallization area to the metal pads of the device-mounting structure, such as by solder or eutectic bonding, to provide electrical and thermal conduction.

BRIEF DESCRIPTION OF THE DRAWINGS

While the novel features of the invention are set forth with particularity in the appended claims, the invention, both as to organization and content, will be better understood and appreciated, from the following detailed description taken in conjunction with the drawings in which:

DETAILED DESCRIPTION OF THE INVENTION

Figure 1:
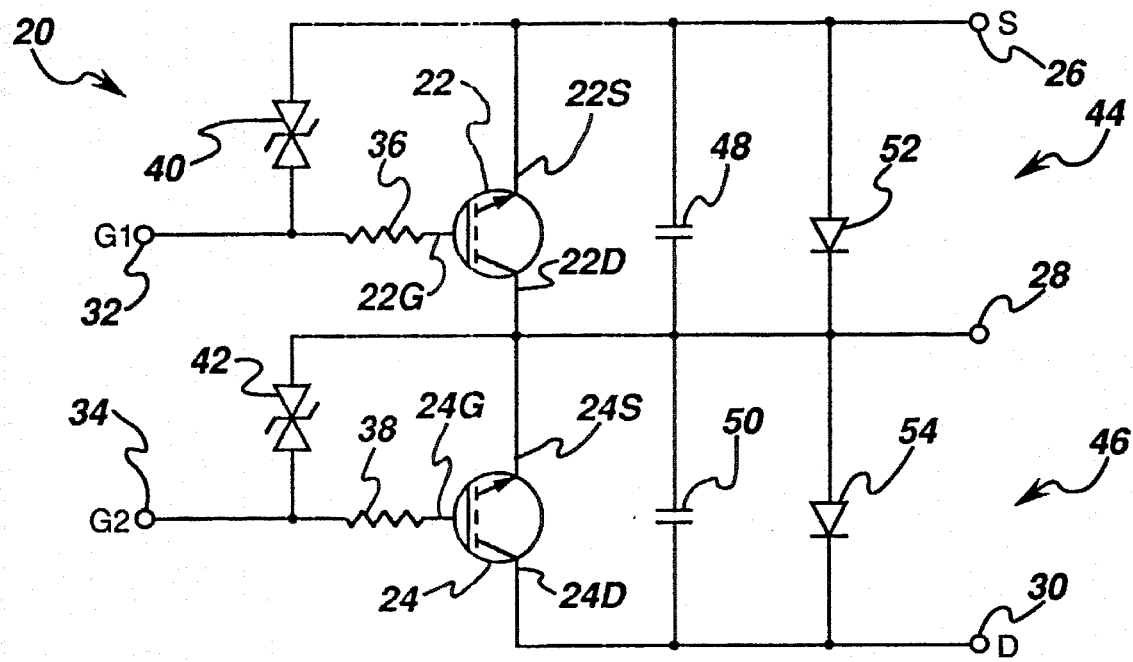
FIG. 1 is an electrical schematic diagram of a half bridge circuit topology.

As shown in FIG. 1, a half bridge circuit 20 includes first and second power semiconductor devices 22 and 24 in the exemplary form of IGBTs (insulated gate bipolar transistors). The first IGBT 22 has source and drain main terminals 22S and 22D, as well as a gate terminal 22G, and the second IGBT has source and drain main terminals 24S and 24D, as well as a gate terminal 24G. Source terminal 24S of the second IGBT 24 is connected to drain terminal 22D of the first IGBT 22. External power connections are made to terminals 26, 28 and 30, with terminal 28 being connected to the junction of source terminal 24s with drain terminal 22d, and IGBTs 22 and 24 include respective individual gate control terminals 32 and 34.

Other conventional circuit elements include series gate resistors 36 and 38, bidirectional Zener diodes 40 and 42 for gate protection, and output protection networks 44 and 46 comprising capacitors 48 and 50 and diodes 52 and 54.

Figure 2:
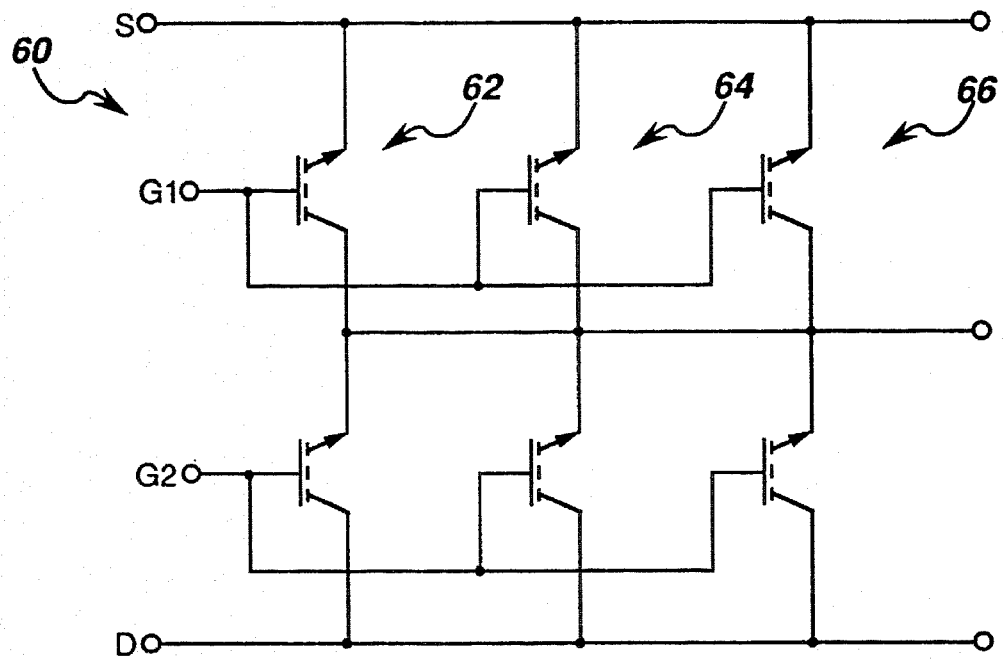
FIG. 2 is an abbreviated electrical schematic diagram of multiple chip sets, each comprising a half bridge circuit configuration, electrically connected in parallel.

FIG. 2 illustrates, in abbreviated form, a multiple half bridge circuit topology 60 wherein several half bridge chip sets 62, 64 and 66, each generally corresponding to circuit 20 of FIG. 1, are connected in parallel for increased power-handling capability.

The circuits of FIGS. 1 and 2 appear straightforward when shown schematically. However, there are practical difficulties in realizing these circuits with actual devices. Typical assembly methods implementing the circuit topologies of FIGS. 1 and 2 place the semiconductor devices in a common plane, with wire bonds to the source and gate leads as described hereinabove. Series resistance and gate parasitics can result in increased losses and limit performance, particularly at higher switching speeds. With the multiple half bridge chip sets 62, 64, 66 of FIG. 2, gate parasitics and series losses are even more severe. Furthermore, for the individual devices to turn on and off at the same time, the conductor lengths to the various devices, most particularly the gate conductors, should all be of the same length. In addition, low-impedance connections are highly desirable.

Figure 3:
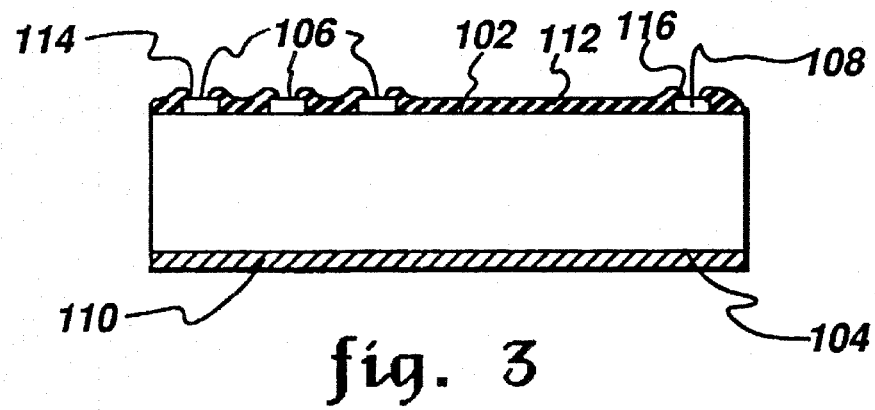
FIG. 3 is a side sectional view depicting an initial step in the fabrication of a power semiconductor device structure in accordance with the invention.

FIG. 3 illustrates a conventional power semiconductor chip 100, such as, for example, a MOSFET or an IGBT having an active major surface 102, conventionally termed the top, and an opposite major surface 104, conventionally termed the bottom. On active major surface 102 is a set of contact pads 106 comprising one main terminal of the device, for example the source terminal in MOSFET terminology. In some instances there is one large connected pad 106, with any portion of pad 106 available for electrical contact. In addition, one or more contact pads 108 comprise a control terminal, such as a gate terminal in MOSFET terminology. On opposite major surface 104 is a uniformly metallized terminal 110 which serves as another main terminal of the device, for example the drain terminal of a MOSFET.

Deposited over active major surface 102 is a thermally-conductive dielectric layer 112, suitably patterned to provide vias 114 and 116 for access to source and gate terminals 106 and 108, respectively. Preferably, thermally-conductive dielectric layer 112 comprises diamondlike carbon (DLC), having a thickness in the approximate range of ten to fifty angstroms. Vias 114 and 116 are formed by selectively removing the DLC layer in an oxygen environment, or by employing a shadow mask during the DLC deposition process.

Diamondlike carbon is a recently-developed dielectric material. Detailed descriptions of its properties and processes for forming thin films thereof are found in commonly-assigned application Ser. No. 08/215,955, filed Mar. 18, 1994 as a continuation of application Ser. No. 08/011,601, filed Feb. 1, 1993 and now abandoned, entitled "Method for Adhering Diamondlike Carbon to a Substrate", the entire disclosure of which is hereby expressly incorporated by reference.

Very briefly, diamondlike carbon can be vacuum deposited at or near room temperature in the form of pin-hole free films as thin as tens of angstroms. At such small thicknesses, the DLC film has insignificant thermal resistance, and does not impede heat transfer. The high resistivity and high breakdown strength of DLC also contribute to its suitability for this application.

Figure 4:
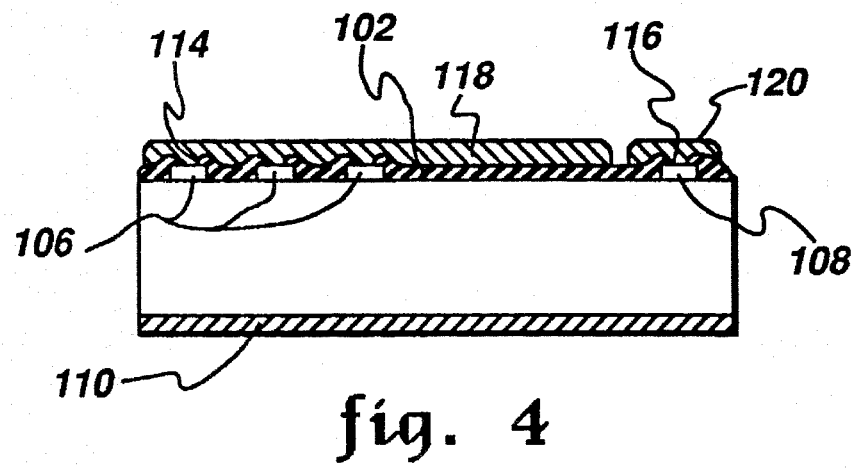
FIG. 4 is a side sectional view depicting a metallization step in the fabrication of a power semiconductor device structure in accordance with the invention.

With reference to FIG. 4, a patterned metallization layer comprising source metallization 118 and gate metallization 120 is formed over thermally-conductive dielectric layer 102, with portions of patterned metallization layer 118, 120 extending through vias 114 and 116 into electrical contact with contact pads 106 and 108, respectively. Very briefly, patterned metallization layer 118, 120 is formed by initially sputtering titanium, then sputtering copper, and finally electroplating copper, for example, to an overall thickness of approximately 0.5 to 5 mils. Metallization layer 118, 120 is then patterned by selectively etching portions employing a photoresist mask (not shown), for example.

Figure 5:
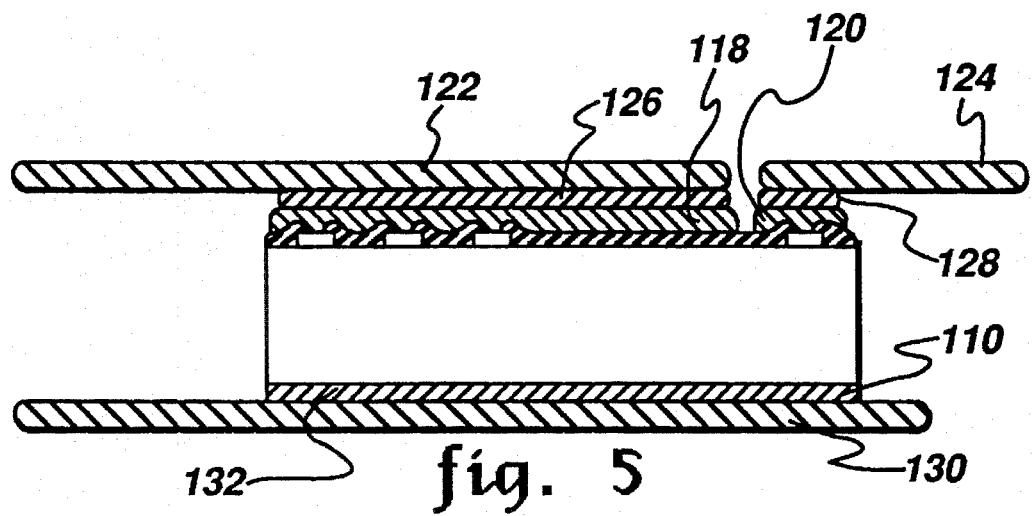
FIG. 5 depicts, in side sectionals view, one form of power semiconductor device structure in accordance with the invention.

Finally, as shown in FIG. 5, a metal structure, in this example wide, strap-like source and gate conductors 122 and 124, is electrically and thermally coupled to selected areas of patterned metallization 118, 120 as by solder 126 and 128, or a eutectic bonding process may be employed.

Thermally and electrically coupled to the device drain terminal 110 is another metal structure, in the representative form of a metal drain conductor 130, likewise bonded to terminal 110 by either solder 132 or a eutectic bonding process.

The power semiconductor device structure of FIG. 5 can advantageously be employed in several configurations.

Figure 6:
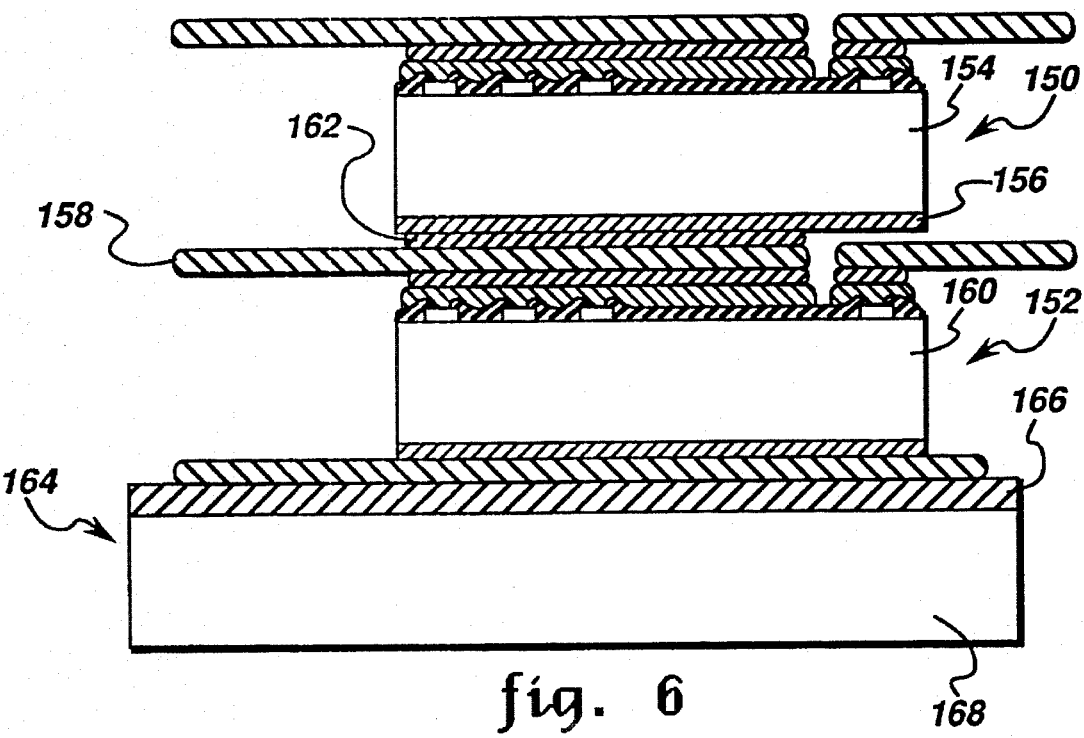
FIG. 6 depicts, in side sectional view, first and second power semiconductor device structures, like that of FIG. 5, in a stacked, half-bridge configuration.

FIG. 6 illustrates a stacked half bridge configuration, corresponding to power semiconductor devices 22 and 24 in the electrical schematic circuit diagram of FIG. 1. The configuration of FIG. 6 includes first and second power semiconductor device structures 150 and 152, each corresponding generally to the structure of FIG. 5. First structure 150 includes a semiconductor chip 154 having a drain electrode 156 on its opposite major surface electrically and thermally coupled to a metal electrode structure 158 of another semiconductor chip 160 of second power semiconductor device configuration 152. As an example of satisfactory electrical and thermal coupling, either solder 162, or eutectic bonding, may be employed.

The metal drain lead of lower device 160 is bonded, such as by soldering, to a suitable substrate 164, such as a direct bond copper BeO substrate comprising a copper layer 166 direct bonded to BeO layer 168.

In the configuration of FIG. 6, the thermal path for upper chip 154 is down through lower chip 160. However, with lower chip 160 on direct bond copper BeO substrate 164, the temperature rise through lower chip 160 and substrate 164 is acceptable, due to their relatively good thermal conductivities.

Figure 7:
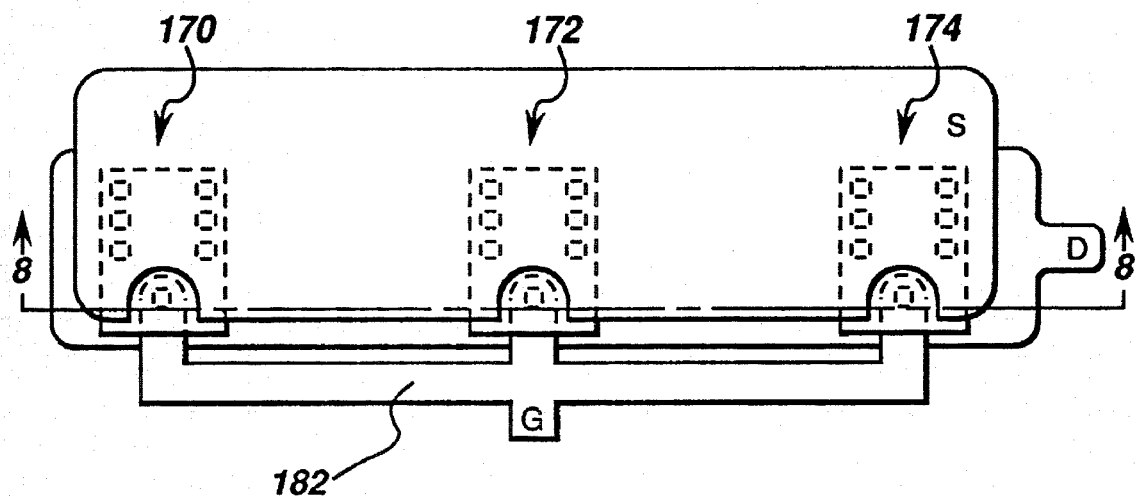
FIG. 7 is a plan view of a parallel half bridge configuration, employing three sets of devices as depicted in FIG. 6.
Figure 8:
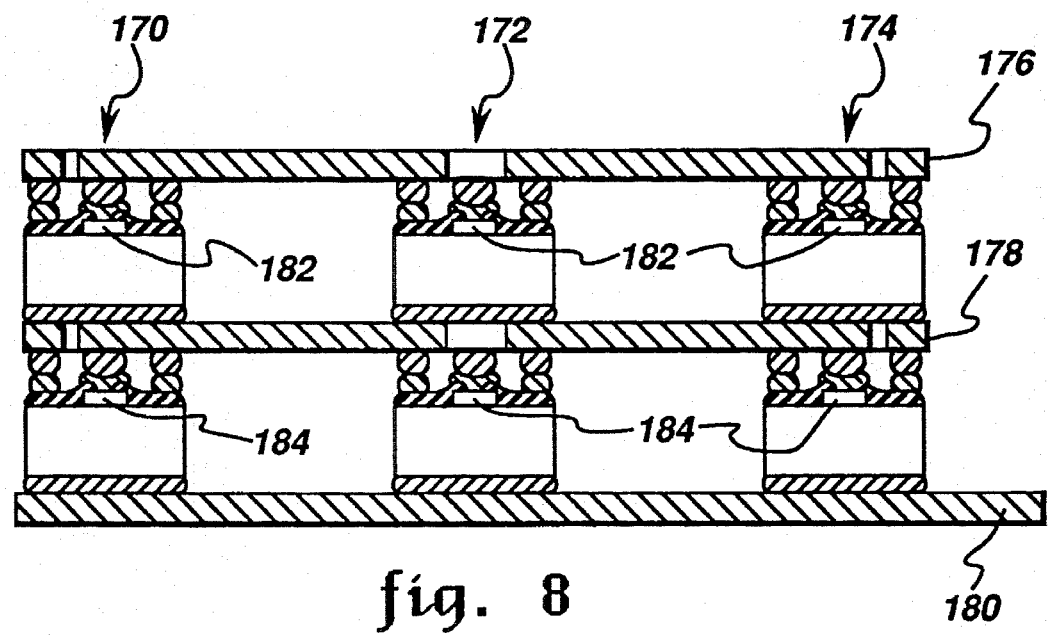
FIG. 8 is a side sectional view of the parallel half bridge arrangement of FIG. 7 taken along line 8—8.

FIGS. 7 and 8 show the physical arrangement of three structures 170, 172, 174 like that of FIG. 5, corresponding to the electrical schematic circuit diagram of FIG. 2. In FIGS. 7 and 8, upper source metallization 176, intermediate source/drain metallization 178 and lower drain metallization 180 are common to all three stacked sets 170, 172, 174. A common gate lead 182 is connected to all three of the upper chips, and another common gate lead 184 (FIG. 8 only) is connected to all three of the lower chips. It will be appreciated that this configuration provides very low impedance connections to all of the device terminals.

At switching speeds of 50 kHz or higher, however, the parallel gate strap structure of FIGS. 7 and 8 may result in different turn-on delays for different parallel devices due to different signal path lengths, and different resistances and inductances.

Figure 9:
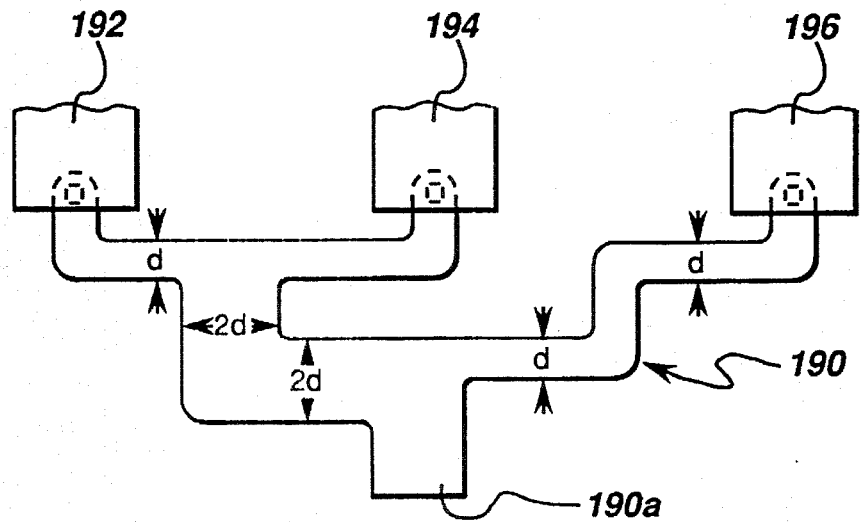
FIG. 9 is a plan view of a parallel gate strap structure suitable for balanced feed to three semiconductor devices, as an alternative to the configuration of FIG. 7.
Figure 10:
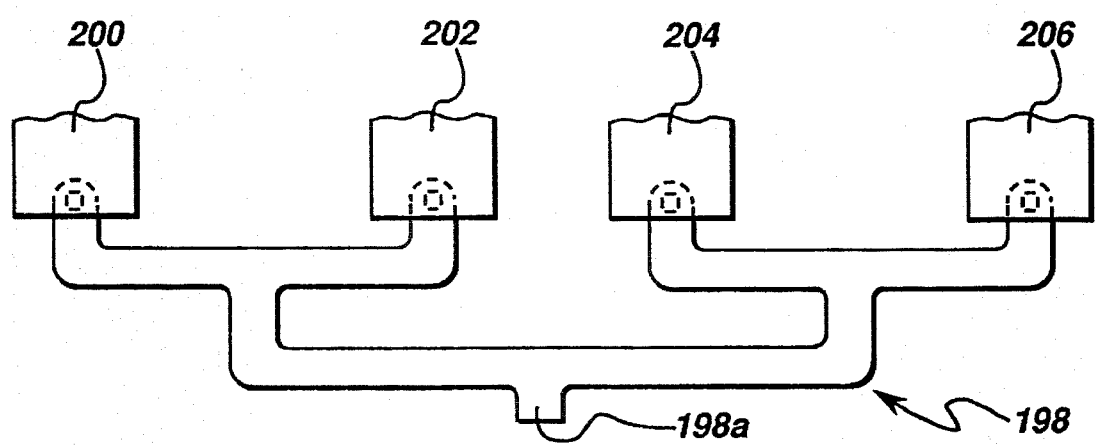
FIG. 10 is a highly schematic plan view representation of a parallel gate strap structure suitable for balanced feed to four semiconductor devices.

FIG. 9 depicts an alternative gate feed structure 190 which matches gate path lengths and resistance and inductance for three semiconductor chips 192, 194, 196. Relative path widths in FIG. 9 are indicated by the designations $d$ and $2d$. FIG. 10 illustrates a similar configuration, comprising a balanced feed 198 for four chips 200, 202, 204 and 206. In each of FIGS. 9 and 10, the path length from the common connection point 190a and 198a, respectively, to each of the chips electrically connected thereto is substantially identical, and the impedances are well matched.

Figure 11:
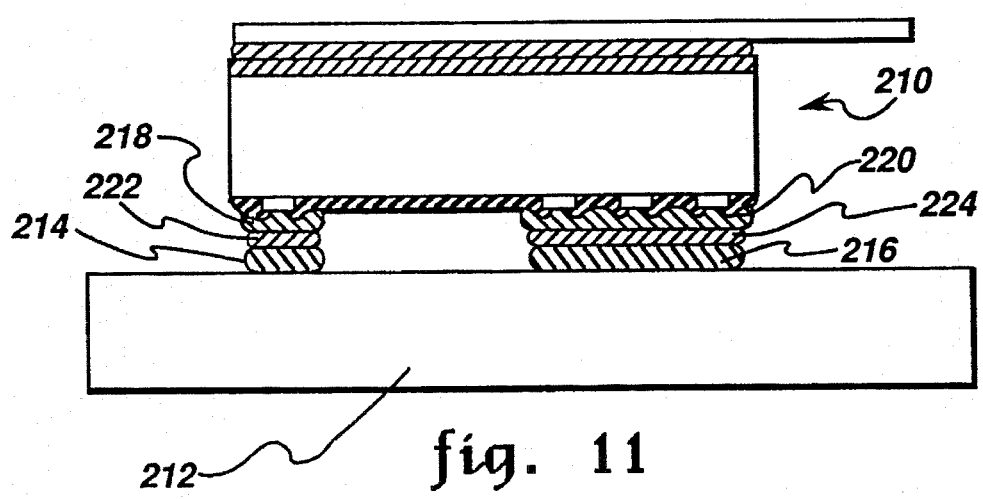
FIG. 11 depicts, in side sectional view, another embodiment of the invention involving a "flip chip" power device.

FIG. 11 illustrates a "flip chip" mounting wherein a power semiconductor device structure 210 such as that of FIG. 5 is mounted upside down onto a device-mounting structure 212, which may comprise a hybrid substrate or the recessed portion of a package (i.e., the bottom of a package cavity). Thus, mounting structure 212 includes metal pad areas 214,216 for electrical connection to contact pads 218,220 on the active surface of the semiconductor chip. The device can be thus mounted by employing solder reflow techniques, resulting in a solder attach 222,224.

An important advantage of the FIG. 11 configuration is that the thermal heat sink is effectively attached to the active major surface of the chip, where the bulk of the device heat is generated, rather than to the opposite major surface of the chip. Since junction temperature during operation is the predominant limiter to device power handling capability and reliability, this configuration results in improved device power handling capability and reliability.

In addition, the interconnection structure of FIG. 11 minimizes parasitic currents, and has low inductance and low resistance, allowing higher frequency operation with reduced losses.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A power semiconductor device structure comprising:
   a semiconductor chip having an active major surface and an opposite major surface, contact pads on the active major surface comprising one main terminal of the chip and a control terminal, and the opposite major surface comprising another main terminal of the chip;
   a thermally-conductive dielectric layer overlying at least portions of the active major surface, with vias formed in said dielectric layer in alignment with said contact pads;
   a patterned metallization layer over said thermally-conductive dielectric layer, portions of said patterned metallization layer extending through said vias into electrical contact with said contact pads; and
   a metal structure bonded to selected areas of said patterned metallization so as to be electrically and thermally coupled thereto.

2. The power semiconductor device structure of claim 1, wherein said thermally-conductive dielectric layer comprises diamondlike carbon.

3. The power semiconductor device structure of claim 2, wherein said diamondlike carbon thermally-conductive dielectric layer is within the approximate range of ten to fifty angstroms in thickness.

4. The power semiconductor device structure of claim 1, including solder bonds between said metal structure and selected areas of said patterned metallization.

5. The power semiconductor device structure of claim 1, wherein said metal structure is eutectic-bonded to selected areas of said patterned metallization.

6. The power semiconductor device structure of claim 1, wherein said metal structure comprises a metal conductor bonded to the opposite major surface of another power semiconductor device structure.

7. The power semiconductor device structure of claim 1, wherein said metal structure comprises a heat-dissipating device-mounting structure.

8. The power semiconductor device structure of claim 7, wherein said heat-dissipating device-mounting structure comprises a substrate and a heat sink attached to said substrate.

9. The power semiconductor device structure of claim 7, wherein said heat-dissipating device-mounting structure comprises a recessed portion of a package.

10. A stacked power semiconductor device configuration comprising:
    first and second power semiconductor device structures, each of said power semiconductor device structures comprising:
    a semiconductor chip having an active major surface and an opposite major surface, contact pads on the active major surface comprising one main terminal of the chip and a control terminal, and the opposite major surface comprising another main terminal of the chip;
    a thermally-conductive dielectric layer overlying at least portions of the active major surface, with vias formed in said dielectric layer in alignment with said contact pads,
    a patterned metallization layer over said thermally-conductive dielectric layer, portions of said patterned metallization layer extending through said vias into electrical contact with said contact pads, and
    a metal electrode structure bonded to selected areas of said patterned metallization so as to be electrically and thermally coupled thereto; and
    the opposite major surface of said semiconductor chip of said first power semiconductor device structure being bonded to the metal electrode structure of said second power semiconductor device structure so as to be electrically and thermally coupled thereto.

11. The stacked power semiconductor device configuration of claim 10, wherein each of said thermally-conductive dielectric layers comprises diamondlike carbon.

12. The stacked power semiconductor device configuration of claim 11, wherein each of said diamondlike carbon thermally-conductive dielectric layers is within the approximate range of ten to fifty angstroms in thickness.

13. The stacked power semiconductor device configuration of claim 10, wherein the opposite major surface of said semiconductor chip of said second power semiconductor device structure is bonded to a heat-dissipating substrate so as to be electrically and thermally coupled thereto.

14. The stacked power semiconductor device configuration of claim 10, including, in each of said power semiconductor device structures, solder bonds between the metal electrode structure and selected areas of the patterned metallization.

15. The stacked power semiconductor device configuration of claim 10, wherein, in each of said power semiconductor device structures, the metal electrode structure is eutectic-bonded to selected areas of the patterned metallization.

16. A power semiconductor device assembly comprising:
    a semiconductor chip having an active major surface and an opposite major surface, contact pads on the active major surface comprising one main terminal of the chip and a control terminal, and the opposite major surface comprising another main terminal of the chip;
    a thermally-conductive dielectric layer overlying at least portions of the active major surface, with vias formed in said dielectric layer in alignment with said contact pads;
    a patterned metallization layer over said thermally-conductive dielectric layer, portions of said patterned metallization layer extending through said vias into electrical contact with said contact pads; and a heat-dissipating device-mounting structure including metal pads bonded to selected areas of said patterned metallization layer so as to be electrically and thermally coupled thereto.

17. The power semiconductor device assembly of claim 16, wherein said thermally-conductive dielectric layer comprises diamondlike carbon.

18. The power semiconductor device assembly of claim 17, wherein said diamondlike carbon thermally-conductive dielectric layer is within the approximate range of ten to fifty angstroms in thickness.

19. The power semiconductor device assembly of claim 16, including solder bonds between said metal pads and selected areas of said patterned metallization layer.

20. The power semiconductor device assembly of claim 16, wherein said selected areas of said patterned metallization layer are eutectic-bonded to said metal pads.

21. The power semiconductor device assembly of claim 16, wherein said device-mounting structure comprises a hybrid substrate.

22. The power semiconductor device assembly of claim 16, wherein said device-mounting structure comprises a recessed portion of a package.

* * * * *